US012757335B2

(12) United States Patent
Steinberg et al.

(10) Patent No.: US 12,757,335 B2
(45) Date of Patent: Oct. 6, 2026

(54) METHOD FOR INTEGRATING A COPPER-GRAPHENE LAMINATE (CGL) IN A MULTILAYER PCB FABRICATION PROCESS

(71) Applicants: Mellanox Technologies, Ltd., Yokneam (IL); BAR ILAN UNIVERSITY, Ramat Gan (IL)

(72) Inventors: Oren Steinberg, Tal Shahar (IL); Elad Mentovich, Tel Aviv (IL); Sima Buchbinder, Haifa (IL); Boaz Atias, Maale Adumim (IL); Eyal Shoham, North District (IL); Adi Levi, Rosh HaAyin (IL); Yosi Ben-Naim, Eilat (IL); Doron Naveh, Petah-Tikva (IL); Ori Azulay, Moshav Yatzitz (IL)

(73) Assignees: MELLANOX TECHNOLOGIES, LTD., Yokneam (IL); BAR-ILAN UNIVERSITY, Ramat Gan (IL)

( * ) Notice: Subject to any disclaimer, the term of this patent is extended or adjusted under 35 U.S.C. 154(b) by 628 days.

(21) Appl. No.: 18/200,352

(22) Filed: May 22, 2023

(65) Prior Publication Data

US 2024/0397636 A1 Nov. 28, 2024

(51) Int. Cl.
*H05K 3/46* (2006.01)
*H05K 1/03* (2006.01)
(Continued)

(52) U.S. Cl.
CPC ........... *H05K 3/4655* (2013.01); *H05K 1/036* (2013.01); *H05K 3/0047* (2013.01); *H05K 3/064* (2013.01);
(Continued)

(58) Field of Classification Search
CPC .... H05K 3/4655; H05K 1/036; H05K 3/0047; H05K 3/064; H05K 3/288; H05K 3/384;
(Continued)

(56) References Cited

U.S. PATENT DOCUMENTS 3,672,948 A 6/1972 Foehring
4,417,722 A 11/1983 Ishii
(Continued)

FOREIGN PATENT DOCUMENTS

CN 105235307 A 1/2016
CN 105779961 A 7/2016
(Continued)

OTHER PUBLICATIONS

Zuo Dunwen, "Modern Processing Technology," Beijing University of Aeronautics and Astronautics Press, pp. 299-301, Mar. 31, 2005.
(Continued)

*Primary Examiner* — Thomas J Hong
*Assistant Examiner* — Jose K Abraham
(74) *Attorney, Agent, or Firm* — Alston & Bird LLP

(57) ABSTRACT

Methods for integrating copper-graphene laminate (CGL) in a multilayer PCB fabrication process and the resulting lamination stacks are disclosed. The methods include providing a core and applying a first graphene layer to the surface of the core. The methods further include applying a metal layer to the first graphene layer and applying a second graphene layer to the metal layer. Further, the methods include applying a photoresist layer to the second graphene layer and applying a protective layer to the photoresist layer. In some embodiments, the methods include applying a metallic plating to lamination stack. The methods further include drilling through the protective layer and at least one of a photoresist layer, the second graphene layer, the metal layer, the first graphene layer, and/or the core.

19 Claims, 6 Drawing Sheets

(51) Int. Cl.
*H05K 3/00* (2006.01)
*H05K 3/06* (2006.01)
*H05K 3/28* (2006.01)
*H05K 3/38* (2006.01)

(52) U.S. Cl.
CPC ............. *H05K 3/288* (2013.01); *H05K 3/384* (2013.01); *H05K 3/4608* (2013.01); *H05K 2203/0207* (2013.01); *H05K 2203/068* (2013.01)

(58) Field of Classification Search
CPC ......... H05K 3/4608; H05K 2203/0207; H05K 2203/068; H05K 3/4611; H05K 3/061; H05K 3/282
See application file for complete search history.

(56) References Cited

U.S. PATENT DOCUMENTS

| | | | |
|---|---|---|---|
| 4,450,034 A | 5/1984 | Stern | |
| 4,455,181 A | 6/1984 | Lifshin | |
| 4,931,425 A | 6/1990 | Kimura | |
| 5,108,532 A | 4/1992 | Thein et al. | |
| 5,256,474 A | 10/1993 | Johnston | |
| 6,117,266 A | 9/2000 | Horzel et al. | |
| 6,432,239 B1 | 8/2002 | Mandai et al. | |
| 7,798,096 B2 | 9/2010 | Mahajani et al. | |
| 9,215,797 B2 | 12/2015 | Mori et al. | |
| 9,384,875 B2 | 7/2016 | Kimura et al. | |
| 9,431,487 B2 | 8/2016 | Bol et al. | |
| 9,924,619 B2 | 3/2018 | Kim et al. | |
| 10,022,947 B2 | 7/2018 | Kimura et al. | |
| 10,518,506 B2 | 12/2019 | Miyazono | |
| 10,717,260 B2 | 7/2020 | Shimizu et al. | |
| 11,105,567 B2 | 8/2021 | Fan et al. | |
| 2005/0112344 A1 | 5/2005 | Redfern | |
| 2006/0042059 A1 | 3/2006 | Satoh | |
| 2008/0173238 A1 | 7/2008 | Nakashima et al. | |
| 2010/0047447 A1 | 2/2010 | Cook | |
| 2010/0051111 A1 | 3/2010 | Matsumoto et al. | |
| 2010/0068383 A1 | 3/2010 | Kato et al. | |
| 2010/0068893 A1 | 3/2010 | Kato et al. | |
| 2010/0196124 A1 | 8/2010 | Fukuma et al. | |
| 2011/0076118 A1 | 3/2011 | Kurita et al. | |
| 2011/0091646 A1 | 4/2011 | Aliatieh | |
| 2011/0123776 A1 | 5/2011 | Shin et al. | |
| 2013/0108839 A1 | 5/2013 | Arnold et al. | |
| 2013/0189635 A1 | 7/2013 | Lim | |
| 2013/0248229 A1 | 9/2013 | Martens | |
| 2013/0299077 A1 | 11/2013 | Hong | |
| 2013/0344246 A1 | 12/2013 | Li | |
| 2014/0053973 A1 | 2/2014 | Shin | |
| 2015/0064470 A1 | 3/2015 | Kimura et al. | |
| 2015/0123080 A1 | 5/2015 | Yamaguchi | |
| 2015/0360370 A1 | 12/2015 | Mazzocco et al. | |
| 2016/0027935 A1 | 1/2016 | Naito et al. | |
| 2016/0049475 A1 | 2/2016 | Bol et al. | |
| 2016/0076829 A1 | 3/2016 | Lee et al. | |
| 2016/0079001 A1 | 3/2016 | Lin et al. | |
| 2016/0093478 A1 | 3/2016 | Guo | |
| 2016/0249445 A1* | 8/2016 | Min | H05K 1/0204 |
| 2017/0029279 A1 | 2/2017 | Kim | |
| 2017/0125136 A1 | 5/2017 | Park et al. | |
| 2017/0130336 A1 | 5/2017 | Fujikura | |
| 2017/0207484 A1 | 7/2017 | Zhamu et al. | |
| 2017/0211706 A1 | 7/2017 | Amir | |
| 2017/0251548 A1* | 8/2017 | Min | H05K 3/4608 |
| 2017/0273181 A1 | 9/2017 | Sohn et al. | |
| 2017/0290167 A1 | 10/2017 | Pun et al. | |
| 2017/0338312 A1* | 11/2017 | Treossi | H10D 62/882 |
| 2019/0047262 A1 | 2/2019 | Minakuchi et al. | |
| 2019/0143369 A1 | 5/2019 | Lin et al. | |
| 2019/0143656 A1 | 5/2019 | Lin et al. | |
| 2019/0145007 A1 | 5/2019 | Lin et al. | |
| 2019/0283377 A1 | 9/2019 | Lin et al. | |
| 2019/0283378 A1 | 9/2019 | Lin et al. | |
| 2019/0283379 A1 | 9/2019 | Lin et al. | |
| 2019/0284712 A1 | 9/2019 | Lin et al. | |
| 2019/0292675 A1 | 9/2019 | Lin et al. | |
| 2019/0292676 A1 | 9/2019 | Lin et al. | |
| 2019/0292720 A1 | 9/2019 | Lin et al. | |
| 2019/0292721 A1 | 9/2019 | Lin et al. | |
| 2019/0292722 A1 | 9/2019 | Lin et al. | |
| 2019/0332015 A1 | 10/2019 | Poiesz et al. | |
| 2021/0091368 A1 | 3/2021 | House et al. | |
| 2021/0091383 A1 | 3/2021 | House et al. | |
| 2021/0100090 A1 | 4/2021 | Chang | |
| 2021/0125850 A1 | 4/2021 | Chen et al. | |
| 2021/0139700 A1 | 5/2021 | Arimoto et al. | |
| 2021/0184181 A1 | 6/2021 | Ding | |
| 2021/0260859 A1 | 8/2021 | Le Rhun | |
| 2022/0131040 A1 | 4/2022 | Chen et al. | |
| 2022/0161537 A1 | 5/2022 | Quellmalz et al. | |
| 2022/0169002 A1* | 6/2022 | Honda | C09J 201/00 |
| 2022/0204348 A1 | 6/2022 | Gao et al. | |
| 2022/0372621 A1 | 11/2022 | Mentovich | |
| 2022/0372622 A1 | 11/2022 | Mentovich | |
| 2022/0377907 A1 | 11/2022 | Mentovich | |
| 2022/0377912 A1 | 11/2022 | Atias | |
| 2023/0002906 A1 | 1/2023 | Mentovich | |
| 2023/0007788 A1 | 1/2023 | Atias | |
| 2023/0007789 A1 | 1/2023 | Mentovich | |

FOREIGN PATENT DOCUMENTS

| | | | | |
|---|---|---|---|---|
| CN | 110602871 A * | 12/2019 | H05K 1/0207 |
| DE | 102008052571 A1 | 4/2009 | |
| DE | 102011056914 A1 | 6/2012 | |
| DE | 112013006022 T5 | 9/2015 | |
| EP | 3723122 A1 | 10/2020 | |
| KR | 20120047107 A | 5/2012 | |
| KR | 20190058231 A | 5/2019 | |
| WO | 2013131508 A1 | 9/2013 | |
| WO | WO-2014124308 A2 * | 8/2014 | H10D 30/43 |
| WO | 2015062760 A1 | 5/2015 | |
| WO | 2017213045 A1 | 12/2017 | |
| WO | 2020152358 A1 | 7/2020 | |

OTHER PUBLICATIONS

Xu Binshi, "Material Surface Engineering," Harbin Institute of Technology Press, p. 300, Dec. 31, 2014.

Chinese Office Action from corresponding Chinese Application No. 202210515308.4 dated Oct. 28, 2023, 4 pages, with English Translation.

Steinberg et al., pending U.S. Appl. No. 18/200,314, filed May 22, 2023.

* cited by examiner

METHOD FOR INTEGRATING A COPPER-GRAPHENE LAMINATE (CGL) IN A MULTILAYER PCB FABRICATION PROCESS

TECHNOLOGICAL FIELD

Embodiments of the present invention relate generally to printed circuit boards (PCB) structures and methods for integrating copper-graphene therein.

BACKGROUND

A PCB is a laminated structure of conductive and insulating layers that are used to support electronic components and to provide electrical connections and open circuits between electrical terminals. In general, each of the conductive layers comprises a pattern of electrical pathways or traces that provides electrical connections on that conductive layer. In addition, vias, or plated through-holes, may be provided to allow electrical interconnections between different conductive layers.

Graphene is known to have several beneficial properties which can passivate copper metal lines and improve by high-frequency conductivity, and/or the like, when incorporated into a PCB. Incorporating graphene into a PCB can be difficult as graphene is easily damaged or destroyed, such as during the lamination process, lithography, the drilling process, and/or the electroplating process. Such damage or destruction may, in turn, lead to improper passivation of the copper and/or lower conductivity. Thus, there exists a problem with incorporating graphene into PCBs and retaining the integrity of the graphene.

BRIEF SUMMARY

Embodiments of the present invention provide an improved method of creating PCBs that integrates graphene as a passivation layer on copper and allows drilling and electroplating without damaging or unintentionally removing portions of the graphene, which may render the PCB useless (e.g., may remove the copper capping layer and render the PCB vulnerable to oxidation and rapid deterioration), as well associated methods for forming the lamination stack comprising the graphene.

In some embodiments a method of forming a lamination stack comprises: providing a core; applying a first graphene layer to a surface portion of the core; applying a metal layer to the first graphene layer; applying a second graphene layer to the metal layer; applying a photoresist layer to the second graphene layer; applying a protective layer to the photoresist layer; drilling through the protective layer and at least one of the photoresist layer, the second graphene layer, the metal layer, the first graphene layer, or the core; applying a metallic plating to the lamination stack, wherein the metallic plating is applied to the lamination stack, such that the metallic plating covers an internal surface of the lamination stack formed by the drilling; and removing the protective layer from the photoresist layer, wherein the removal of the protective layer causes a removal of the metallic plating in contact with the protective layer.

In some embodiments, the metallic plating is a material comprising at least one of palladium, tin, or copper.

In some embodiments, removing the protective layer comprises applying heat at a predefined temperature to the lamination stack, wherein the temperature is based on the protective layer. In some embodiments, the temperature is in the range of approximately 90 degrees Celsius to approximately 180 degrees Celsius.

In some embodiments, the protective layer is a material comprising a resiliency to Hydrogen score of at least one, two, three, four, eleven, twelve, thirteen, or fourteen.

In some embodiments, the protective layer is a material comprising at least one of a polymethyl methacrylate (PMMA), a polydimethyloxyaniline (PDMA), a poly ethylene vinyl acetate, a water-insoluble film polymer, a polyetherimide, a thermoplastic polymer, or an elastomeric polymer.

In some embodiments, the protective layer comprises at least one of an adhesive tape, a thermal release tape, a dry film photoresist, an atomic deposition layer, or a photoresist.

In some embodiments, the protective layer is applied in a room-temperature environment.

In some embodiments, a lamination stack integrating copper-graphene laminate comprises: a core; a first graphene layer disposed on a surface portion of the core; a metal layer disposed on the first graphene layer; a second graphene layer disposed on the metal layer; a photoresist layer disposed on the second graphene layer; and a protective layer disposed on the photoresist layer, wherein the lamination stack defines an opening through the protective layer and at least one of the photoresist layer, the second graphene layer, the metal layer, the first graphene layer, or the core.

In some embodiments, a metallic plating is disposed on the surface of the lamination stack, such that the metallic plating covers an internal surface of the lamination stack defined by the opening. In some embodiments, the metallic plating is a material comprising at least one of a palladium or copper. In some embodiments, the metallic plating in contact with the protective layer and the protective layer are removed.

In some embodiments, the metal layer defines a gap. In some embodiments, the first graphene layer and the second graphene layer are cut to correspond to the gap.

In some embodiments, the protective layer is a material comprising a potential of Hydrogen score of one, two, three, four, eleven, twelve, thirteen, or fourteen.

In some embodiments, the protective layer is a material comprising at least one of a polymethyl methacrylate (PMMA), a poly (PDMA), a poly ethylene vinyl acetate, polyetherimide, a water-insoluble film polymer, a thermoplastic polymer, or an elastomeric polymer.

In some embodiments, the protective layer comprises at least one of an adhesive tape, a dry film photoresist, an atomic deposition layer, or a photoresist.

In some embodiments, the protective layer is applied in a room-temperature environment.

In some embodiments, the opening is a via.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having thus described the disclosure in general terms, reference will now be made to the accompanying drawings, which are not necessarily drawn to scale. The components illustrated in the figures may or may not be present in certain embodiments described herein. Some embodiments may include fewer (or more) components than those shown in the figures.

Figure 1A:
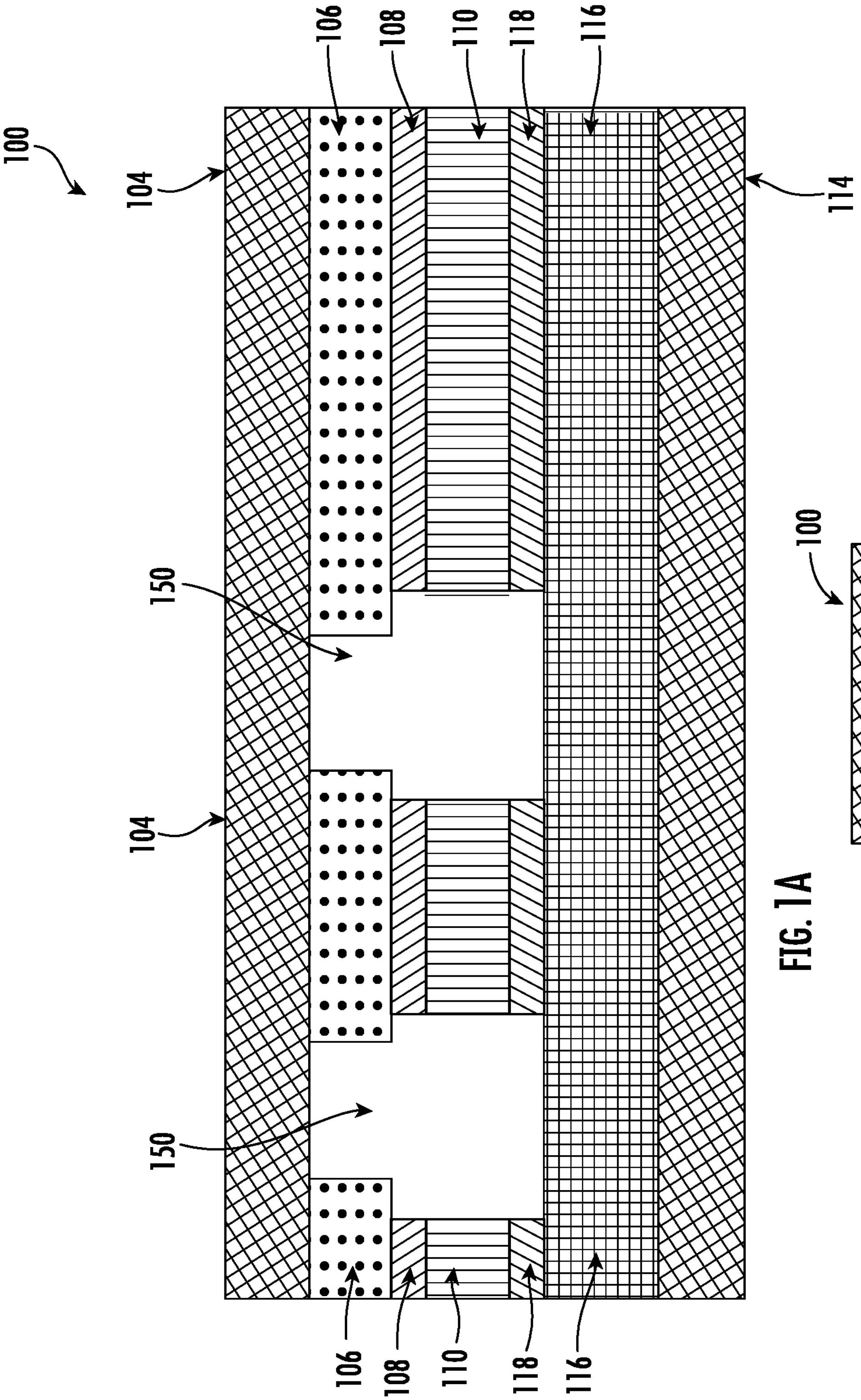
Figure 1B:
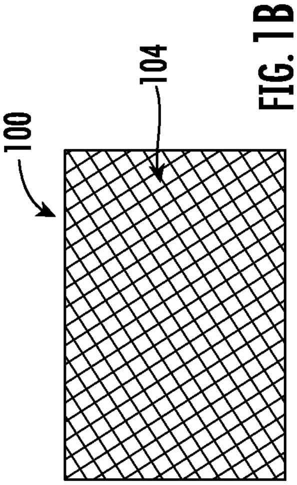
Figure 2A:
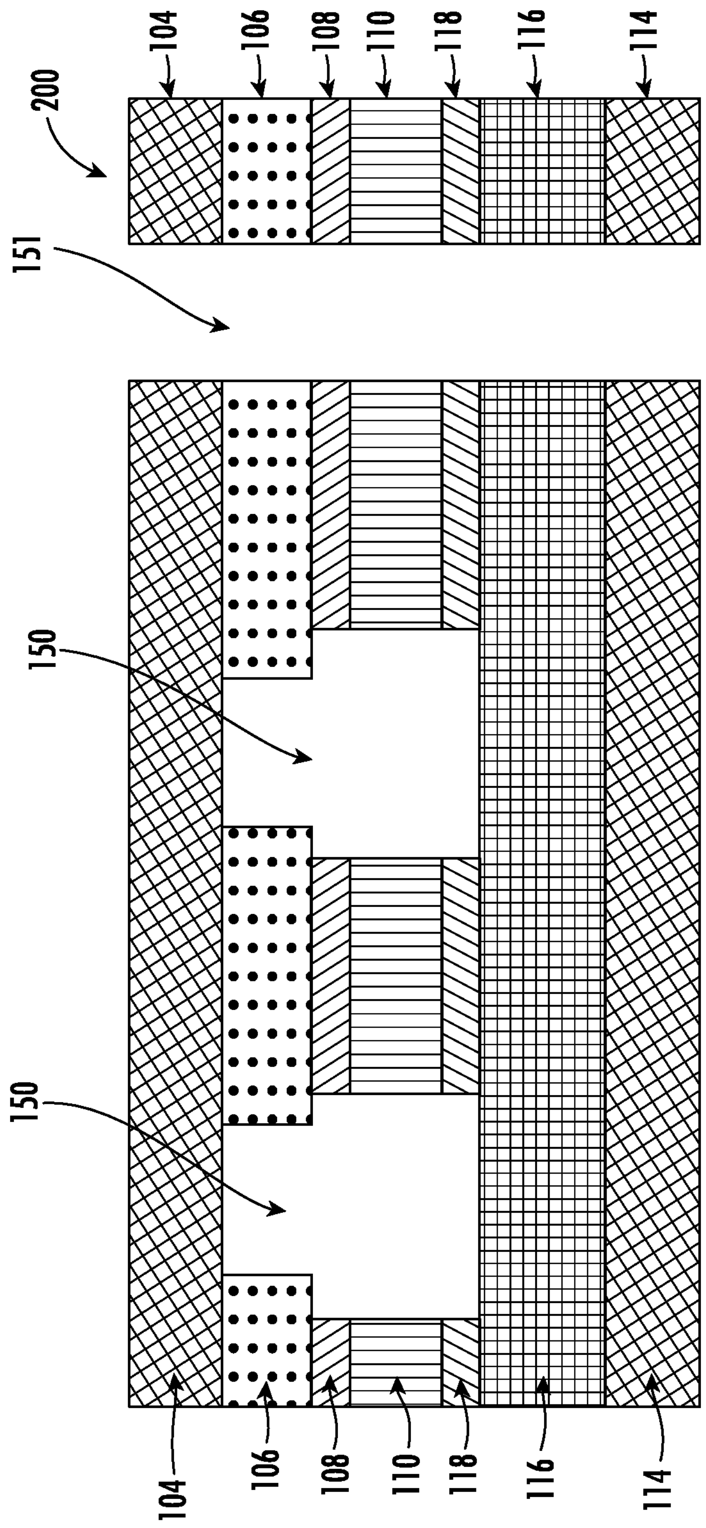
Figure 2B:
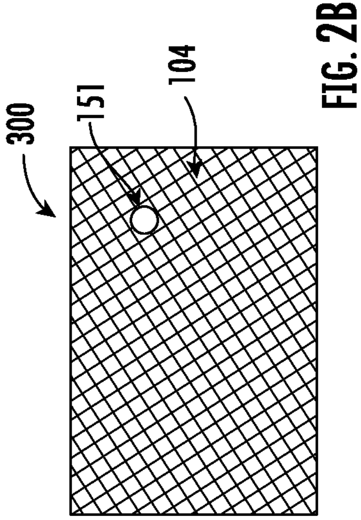
Figure 3A:
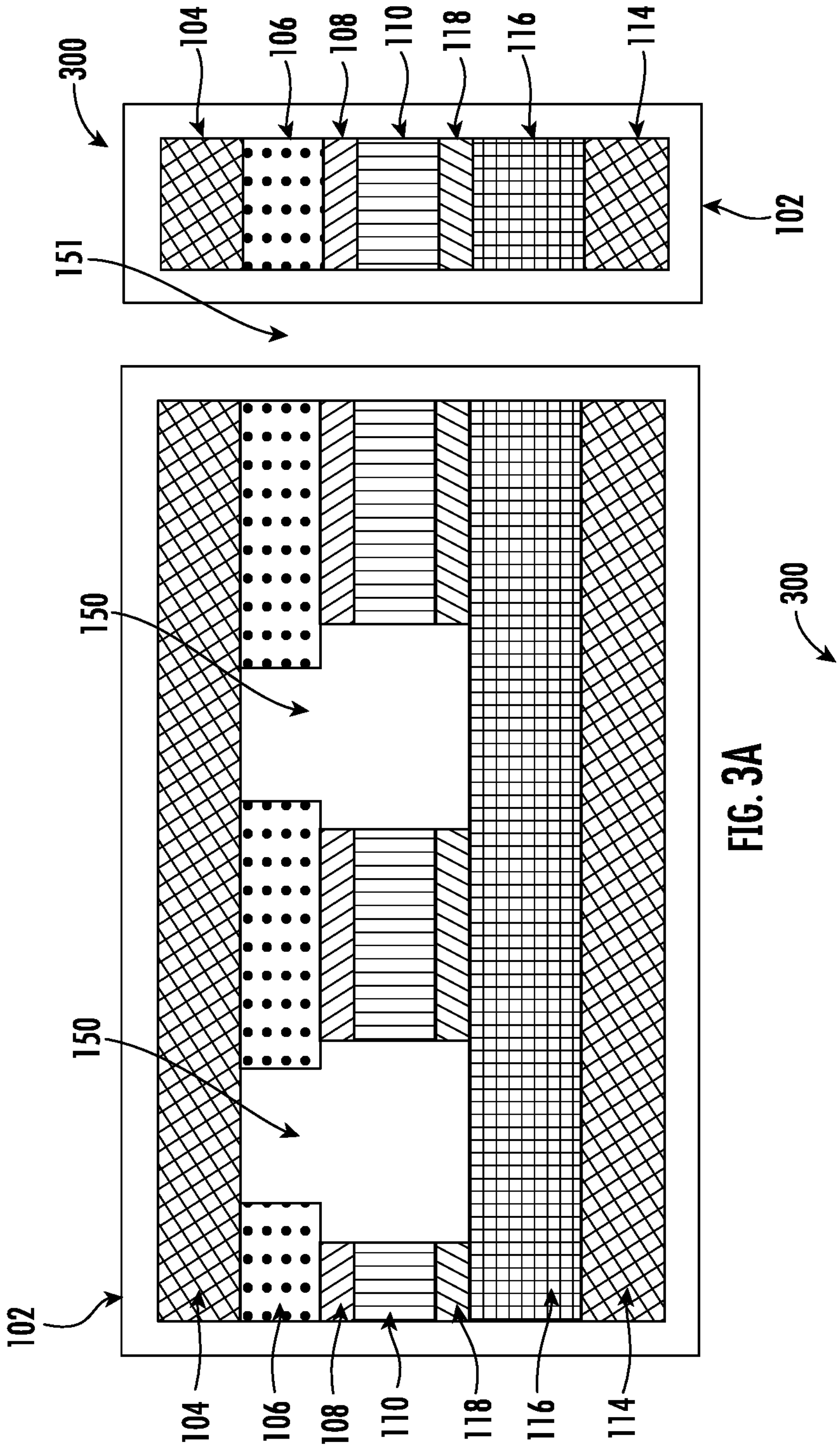
Figure 3B:
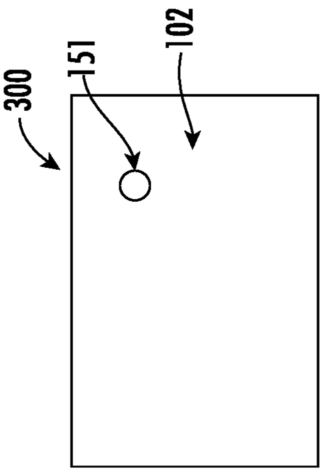
Figure 4A:
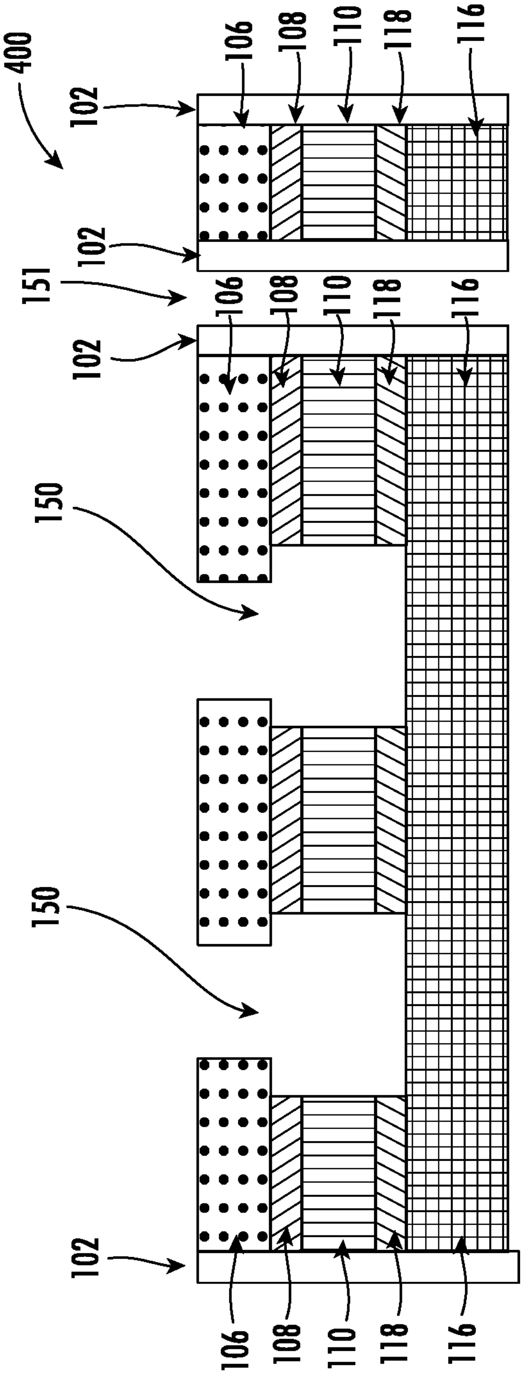
Figure 4B:
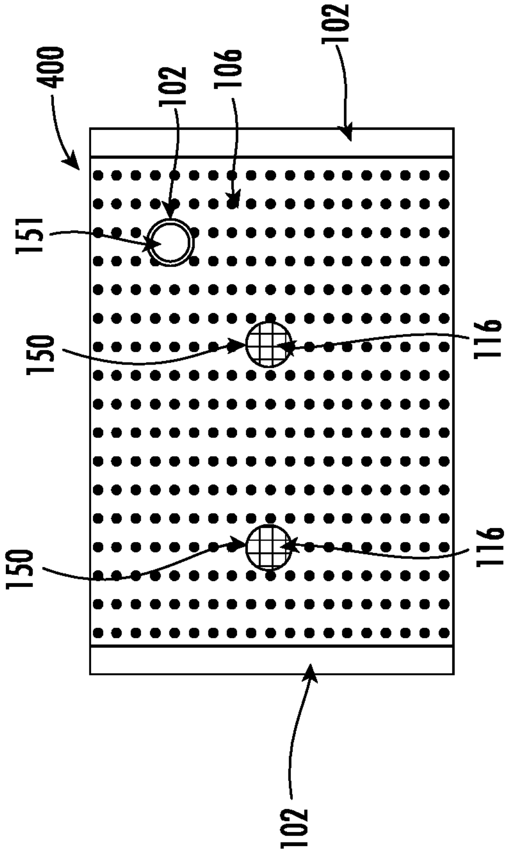
Figure 5:
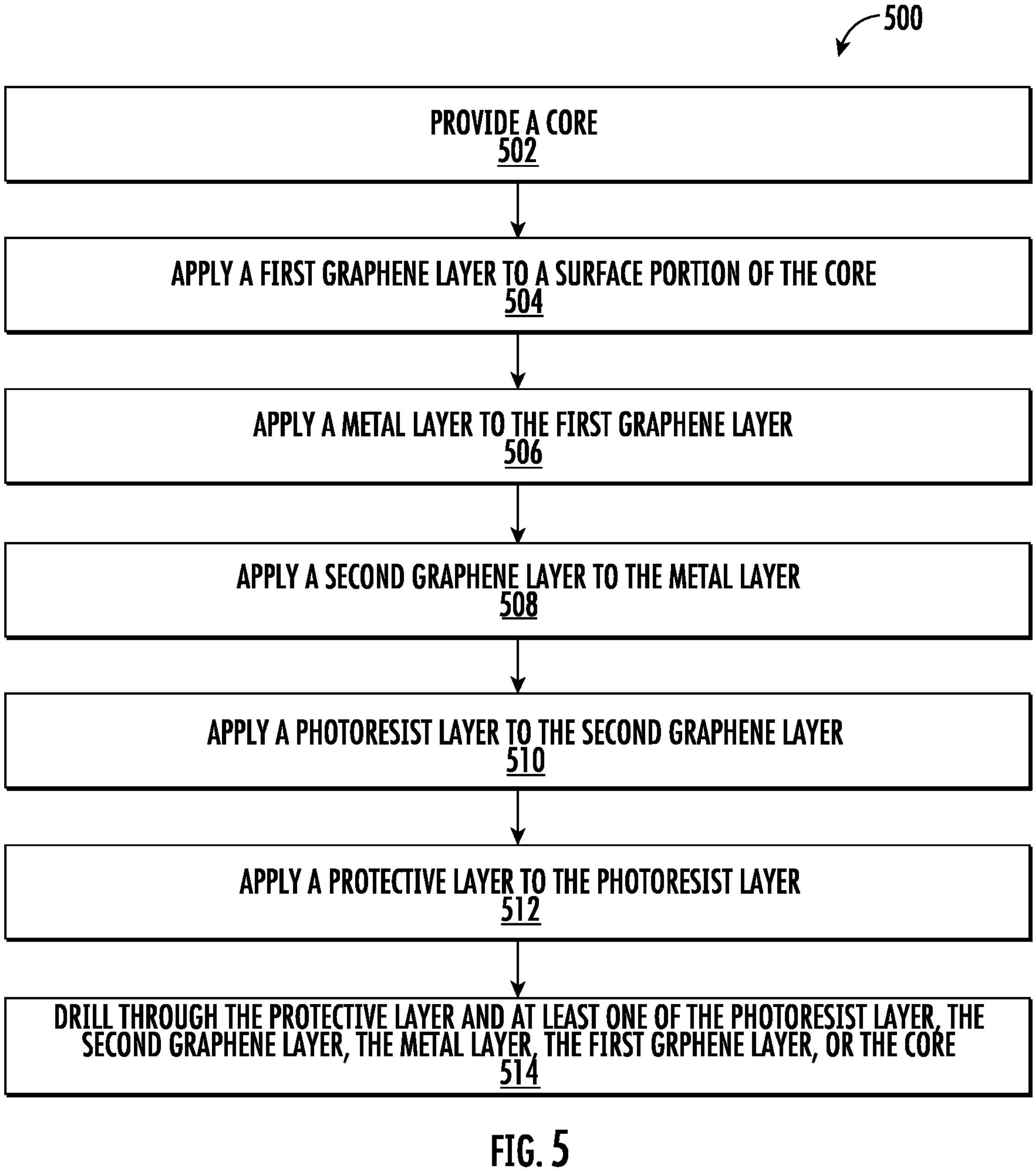
Figure 6:
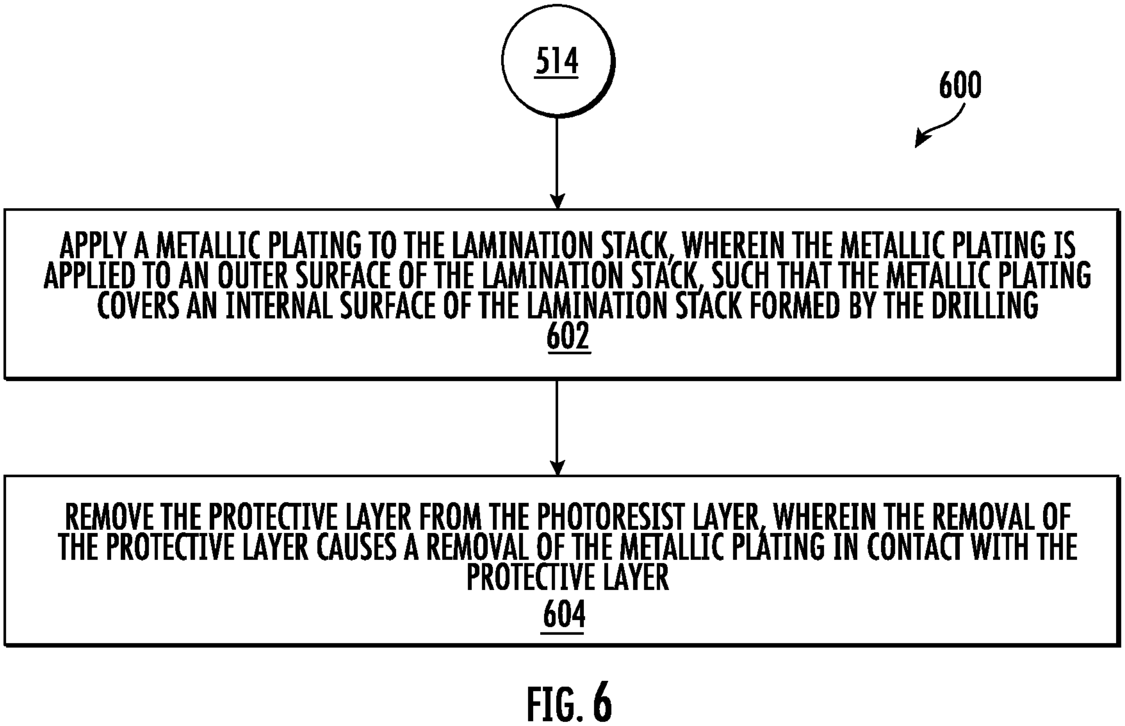

FIG. 1A illustrates an exemplary illustration of a lamination stack, in accordance with one or more embodiments of the present invention;

FIG. 1B illustrates a top plan view of the lamination stack provided in FIG. 1A, in accordance with one or more embodiments of the present invention;

FIG. 2A illustrates an exemplary cross-sectional view of a lamination stack comprising at least a via drilled through the layers of the lamination stack, in accordance with one or more embodiments of the present invention;

FIG. 2B illustrates a top plan view of the lamination stack provided in FIG. 2A, in accordance with one or more embodiments of the present invention;

FIG. 3A illustrates an exemplary cross-sectional view of a lamination stack comprising a metallic plating, in accordance with one or more embodiments of the present invention FIG. 3B illustrates a top plan view of the lamination stack provided in FIG. 3A, in accordance with one or more embodiments of the present invention;

FIG. 4A illustrates an exemplary cross-sectional view of a lamination stack after removal of at least the metallic plating and/or the protective layer(s), in accordance with one or more embodiments of the present invention;

FIG. 4B illustrates a top plan view of the lamination stack provided in FIG. 4A, in accordance with one or more embodiments of the present invention;

FIG. 5 illustrates an exemplary flowchart of a process for creating a lamination stack, in accordance with one or more embodiments of the present invention; and FIG. 6 illustrates an exemplary flowchart of a process for removing a protective layer from a photoresist layer in the lamination stack, in accordance with one or more embodiments of the present invention.

DETAILED DESCRIPTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The term "exemplary" and "example" as may be used herein are not provided to convey any qualitative assessment, but instead merely to convey an illustration of an example. As used herein, terms such as "front," "rear," "top," "bottom," "inside," "outside," "inner," "outer," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances. Thus, use of any such terms should not be taken to limit the spirit and scope of embodiments of the present invention.

A lamination stack, generally, is a structure formed by layers of materials (e.g., conductive and non-conductive) that are heated, pressed, and/or further processed to form a PCB. For example, such materials may include a non-conductive material (e.g., the core) possessing dielectric properties, an adhesive layer, and a conductive material, such as the commonly used metal, copper (e.g., copper foil). The lamination stack may then be laminated (i.e., heated and/or pressurized under vacuum and/or controlled gas atmosphere) to solidify a bond between the layers of material to create the structure of the PCB. In some aspects of the present invention, heat may be applied to the bottom of the lamination stack (e.g., from below the lamination stack), applied to the top of the lamination stack (e.g., from above the lamination stack), and/or applied from various directions around the lamination stack (e.g., using an oven chamber to heat the lamination stack from multiple sides). The electrical and thermal conductive material (e.g., copper) may then be etched to create the conductive trace of the PCB. In some aspects, the process of adding a metallic plating after the drilling and electroplating of the lamination stack may be used to create the PCB. For instance, a metallic plating, such as copper, palladium, tin, and/or the like, is often used within the vias drilled through the lamination stack to promote conductivity between a top and bottom surface of the lamination stack. However, a problem arises as, in the process of applying the metallic plating on the inner surface of the vias, the metallic plating is applied on the entire surface of the lamination stack (e.g., including the top and bottom of the lamination stack). As a result, the metallic plating must be removed from certain locations (e.g., the top and bottom of the lamination stack) without damaging the materials adjacent to the metallic plating (e.g., the protective layer, any lithographically patterned material such as a photoresist layer, graphene layer, and/or the like).

Graphene, an allotrope of carbon, consists of a single layer of atoms (one atomic layer of graphite) arranged in a two-dimensional honeycomb lattice nanostructure. It is considered a semi-metal having unusual electronic properties that may be described by theories for massless relativistic particles. One characteristic of graphene is that it conducts heat and electricity very efficiently along its plane. In addition, it has exceptionally high tensile strength, electrical conductivity, and transparency. Additionally, graphene can passivate the surface of copper and prevent oxidation of copper lines exposed to air. In high-frequency copper transmission lines, the electrical signal is concentrated close to the outer skin of the copper, where the conductivity of the capping layer takes significant portion of the overall conductivity. In the case where graphene is grown on copper by CVD, the thermal annealing causes copper grain growth and results in improved thermal conductivity of copper by about 20%. The surface roughness of copper after graphene growth is improved significantly and the smoother surface has lower impedance at high frequency.

Due to such properties of graphene, the use of graphene as a capping layer to copper within a lamination stack could have beneficial effects on the properties of the resulting PCB, including higher bandwidth, greater conductivity, and better thermal management over conventional PCBs. However, there exists a problem in creating PCB structures when integrating graphene in the stack-up process of the PCB (pre-lamination of the PCB layers within a lamination stack). Thus, it is important to protect the graphene from damage caused during the lamination process, brown copper oxidation, the drilling process, and the removal process of the protective layer and metallic plating.

According to embodiments of the present invention, a protective layer may be placed on the outer surface of materials of the lamination stack (e.g., the core, the graphene layer(s), the adhesive layer, the lithographically patterned layer (e.g., a photoresist layer), the conductive metal layer such as copper, and/or the like) before applying a metallic plating. By adding the protective layer to the outer surface of materials of the lamination stack, the metallic plating may be removed in certain locations without damaging the materials underneath. In contrast, if the metallic plating were applied directly to a graphene layer or other layer (e.g., lithographically patterned layer), attempts to remove the metallic plating to finalize the PCB structure could damage the underlying layer. Accordingly, the use of a protective layer between the metallic plating and underlying layers of the lamination stack according to embodiments of the invention allow portions of the metallic plating to be removed from the lamination stack without causing damage to the underlying materials and may allow only portions of the metallic plating to be removed (e.g., the metallic plating on the top and bottom surface of the lamination stack which are in contact with the protective layer) without removing the metallic plating on other surfaces of the lamination stack (e.g., the metallic plating inside the vias).

With reference to FIGS. 1A, 1B, 2A, 2B, 3A, 3B, 4A, and 4B, a lamination stack and a method of forming a lamination stack comprising a protective layer according to embodiments of the present invention is illustrated. For example, in FIG. 1A, a side view of a lamination stack 100 (which forms a PCB) is shown that includes a core material 116 a first layer of graphene 118, a metal layer 110 (such as copper), a second graphene layer 108, a photoresist (or any graphene-protective film) layer 106, and at least one protective layer (e.g., 104 and/or 114) (such as a photoresist dry film). In some embodiments, a connecting layer (e.g., a dielectric glue) is disposed between adjacent layers of the lamination stack 100. Although the metal layer 110 is herein described as a metal layer, the metal layer 110 may also be any conductive material. With reference to FIG. 1B, a top view of the lamination stack 100 of FIG. 1A is shown. Similarly, FIGS. 2A and 2B show a side view of the lamination stack 200 (which comprises the materials of the lamination stack 100) and a top view of the lamination stack 200, respectively. FIGS. 2A and 2B additionally comprise a via 151 drilled through the lamination stack 200. Likewise, FIGS. 3A and 3B show a side view of the lamination stack 300 (which comprises the materials of the lamination stacks 100 and 200) and a top view of the lamination stack 300, respectively. FIGS. 3A and 3B, however, additionally comprise a metallic plating 102 that has been applied on the surfaces of the lamination stack 300, including an inner surface of the via 151. Lastly, FIGS. 4A and 4B show a side view of the lamination stack 400 (which comprises the materials of the lamination stacks 100, 200, and 300) and a top view of the lamination stack 400, respectively. FIGS. 4A and 4B additionally depict the lamination stack after removal of the protective layer and the overlying portions of metallic plating, such that there are strategic leftover portions of metallic plating 102 (e.g., both inside the vias and on the outer side portions of the lamination stack 400). Thus, FIGS. 4A and 4B depict the removal of the bottom and top portions of the metallic plating adjacent to the top surface of the photoresist layer (or other such lithographically patterned layer) 106 and the metallic plating adjacent to the bottom surface of the core 116.

Turning again to FIGS. 1A and 1B, the lamination stack 100 includes a core material 116, a first layer of graphene 118 applied to a surface of the core material, a metal layer 110 (such as copper), a second graphene layer 108, a photoresist layer 106, and at least one protective layer (e.g., 104 and/or 114) (such as a photoresist dry film). In some embodiments, a connecting layer (e.g., a dielectric glue) is disposed between adjacent layers of the lamination stack 100. In some embodiments, a first protective layer 104 may be applied to a top surface of the core 116, and a second protective layer 114 may be applied to a bottom surface of the core 116. The first and/or second protective layers 104, 114 may act to protect the core's surface from any damage that may occur in the process of adding the metallic plating to the stack and/or removing the metallic plating. Such embodiments are further described below with respect to FIGS. 2A and 2B, 3A and 3B, 4A and 4B.

In some embodiments, and as described above, before the photolithography and/or photoengraving of the photoresist layer 106, a protective layer 104 (and/or 114) may be added to the outer surface(s) of the lamination stack, such as the top-portion of the lamination stack (e.g., protective layer 104), the bottom-portion of the lamination stack (e.g., protective layer 114), the side portions of the lamination stack (not pictured), and/or the like. Such addition of protective layers may be strategically added to specific surfaces or locations on the lamination stack, such as where the metallic plating will need to be removed during the process of creating the PCB.

In some embodiments, and as shown in FIG. 1A, a portion of the lamination stack 100 may comprise interior holes or micro-vias such as that shown as gaps 150, where the gaps 150 are formed in only a portion of some of the layers within the lamination stack (e.g., a portion of the first graphene layer 118, a portion of the metal layer 110, a portion of the second graphene layer 108, and a portion of the photoresist layer 106, as depicted in the figure). In some embodiments, these portions that are missing from the materials of the lamination stack that create the gaps 150 may be pre-drilled and/or etched before applying the protective layer 104 to the top surface of the photoresist layer 106. With reference to FIG. 1B, a top level view of the lamination stack 100 of FIG. 1A is shown, according to embodiments of the present invention. For example, in FIG. 1B shows a protective layer 104 from a top view.

In some embodiments, a patterned mask (not shown) may be applied adjacent to the photoresist layer (or any lithographically patterned material or layer) 106, such that when light is applied, the mask which is disposed between the light source and the photoresist layer, then the photoresist layer-which is not protected by the mask-will change its solubility. In other areas, the patterned mask will block the light, such that no change in the photoresist material occurs in the regions underlying the mask. The mask may then be removed, and a solvent or developer can be applied to the surface of the photoresist. Because the solubility of portions of the photoresist have been changed, those portions will be dissolved by the solvent or developer, forming gaps (150) in the photoresist layer 106 and exposing the second graphene layer 108 beneath (e.g., the graphene layer directly underneath the photoresist layer 106). In some cases (e.g., where a negative photoresist is used), the application of light will serve to strengthen the unmasked regions of the photoresist material. Thus, in these cases, the application of the solvent will degrade or wear away only the portions of the photoresist layer 106 that were not exposed to the light.

With the gaps formed in the photoresist layer 106, the first graphene layer 118 and second graphene layer 108, and the metal layer 110, may be etched (e.g., via wet etching) to the same pattern of the gaps in the photoresist layer 106. In some embodiments, the gaps 150 in the photoresist layer 106 may be of a different size (e.g., width and/or length) than the gaps

150 formed in the graphene layers (118 and 108) and the metal layer 110. Subsequently, and in some embodiments, a protective layer 104 and/or 114, may be applied to the top and bottom of the lamination stack 100 in preparation for a drilling procedure, as shown in FIGS. 2A and 3A. In some embodiments, the protective layer 104 is a material comprising at least one layer of polymethyl methacrylate (PMMA), polydimethyloxyaniline (PDMA), poly ethylene vinyl acetate, polyetherimide, water-insoluble film polymer, thermoplastic polymer, or elastomeric polymer. In some embodiments, the protective layer 104 comprises an adhesive tape, a thermal plastic release tape, a dry film photoresist, an atomic deposition layer, a photoresist, and/or the like. In some embodiments, and based on the material of the protective layer, the protective layer 104 and/or 114 may be applied to the lamination stack 100 by applying the protective layer 104 and/or 114 at room temperature, such as where the protective layer 104 is a photoresist material. In some embodiments, the photoresist material may be baked and/or heated at a temperature range of 90 degrees Celsius to 180 degrees Celsius. In some embodiments, the photoresist material may be applied by a spray coating and/or an ultrasonic spray coating.

In some embodiments, and where the protective layer 104 is a thermal release tape, the protective layer 104 may be applied to the photoresist layer 106 by laying a sticky (or adhesive) surface of the thermal release tape on the top surface of the photoresist layer 106 and/or a sticky surface of the thermal release tape on the bottom surface of the core 116. As will be understood by a person of ordinary skill in the art, the sticky surface of the thermal release tape may be applied to any exterior surface of the lamination stack (e.g., a bottom surface of a core, a top surface of the core, a bottom surface of a lithographically patterned material, a top surface of a lithographically patterned material, a top or bottom surface of a metal layer, and/or the like). In some embodiments, and where the protective layer 104 is a dry film photoresist, the protective layer 104 may be applied by heat and pressure at the same time.

The protective layers 104 and 114 may thus serve to shield and protect one or more of the intermediate layers (e.g., the core material 116, the first layer of graphene 118, the metal layer 110, the second layer of graphene 108, the photoresist layer 106 in the depicted embodiment) as a metallic plating is applied and/or removed. Such embodiments are described more fully herein with respect to FIGS. 2A, 2B, 3A, 3B, 4A, 4B, 5, and 6.

With reference to FIGS. 2A and 2B, a via 151 may be drilled through the layers of the lamination stack 100 to form the lamination stack 200. As such, the via 151 may, for example, be used for creating conductive pathways between layers of the PCB, once electroplating and/or application of the metallic plating has occurred. In some embodiments, and after the via 151 has been drilled, a metallic plating may be applied to the outer surfaces of the lamination stack (100, 200, 300), such as through an electroplating process. Such via(s) 151 may be used as a conductive path between layers of the PCB (e.g., different lamination stacks may be adjacent to each other to form the PCB) and/or as a screw-hole to hold the different layers of the PCB in a specific position.

By way of non-limiting example, the electroplating of the lamination stack may comprise an application of a metallic plating to the inner surface of the vias, where the metallic plating may comprise copper and/or other such conductive materials (tin, palladium, copper and/or the like). The metallic plating applied to the inner surface of the vias may provide a conductive path from the top surface of the lamination stack to the bottom surface of the lamination stack, and such a conductive path may include the material layers within the lamination stack. For instance, the conductive path may pass through at least the core layer 116, the first graphene layer 118, the metal layer 110, the second graphene layer 108, and/or the photoresist layer 106, from the top surface to the bottom surface.

With reference to FIGS. 3A and 3B, a depiction of a lamination stack comprising a metallic plating 102 is shown. By way of non-limiting example, the metallic plating 102 of the metallic plating process (e.g., an electroplating process that is used to apply the metallic plating) may be disposed on top, bottom, and sides of the lamination stack, as well as inside any vias drilled through the lamination stack 100 (e.g., via 151), such as the inner surface of the drilled via 151 shown in FIGS. 3A and 3B. In some embodiments, the metallic plating 102 may comprise at least one of palladium and/or copper material. In reference to FIG. 3B, a top level view of the lamination stack 300 of FIG. 3A is shown, according to embodiments of the present invention. For example, in FIG. 3B, a top view of a lamination stack 300 is shown and shows the metallic plating 102 from a top view and via 151.

With reference to FIGS. 4A and 4B, a lamination stack 400 is shown from a side view and a top view, respectively. In some embodiments, a protective layer 104 adjacent to the top surface of the photoresist layer 106 may be removed without damaging the underlying photoresist layer 106. In some embodiments, a photoresist layer 106 adjacent to the graphene surface under the protective layer 104 may be removed together with layer 104 without damaging the underlying graphene surface. For instance, and where the protective layer 104 comprises a thermal release tape, the protective layer 104 and the photoresist layer may be removed by applying heat to the surface of the protective layer 104. In some embodiments, the removal of the protective layer may further comprise the additional removal of the metallic plating 102 overlying the protective layer 104 (the top surface of the metallic plating 102 and the bottom surface of the metallic plating 102 as shown in FIG. 3A).

In some embodiments, the protective layer (104 shown in FIG. 3A) and the top layer of the metallic plating (102 shown in FIG. 3A) may be removed by applying heat at a predefined temperature to the lamination stack based on the protective layer 104 and its properties. Such a process is described more fully with respect to FIGS. 5 and 6

With reference to FIG. 5, a method 500 for creating a lamination stack is described, in accordance with one or more embodiments of the present invention. In some embodiments, the lamination stack 100, 200, 300, and 400 may be used as depictions of the processes described herein.

As shown in block 502, the method 500 may comprise the step of providing a core. In some embodiments, the lamination stack (100, 200, 300, 400) may comprise a core 116 that is a dielectric. In some embodiments, the core 116 may comprise at least one of polyimide, polyester, polyurethane, bismaleimide triazine (BT), cyanate ester, fused silica, woven glass, fiberglass, microfiber glass, epoxy resin, phenol compounds, polytetrafluoroethylene (PTFE), low density polyethylene (LDPE), high density polyethylene (HDPE), polyethylene terephthalate (PET), thermoplastic polyurethane (TPU) or ceramic material.

As shown in block 504, the method 500 may comprise the step of applying a first graphene layer to a surface portion of the core. In some embodiments, and by way of non-limiting example, the lamination stack (100, 200, 300, 400) may comprise a plurality of graphene layers, including a first graphene layer 118, which may be disposed and/or grown on 110). For instance, the graphene layers (at least a first graphene layer 118 and a second graphene layer 108) may be grown on the surface of the core 110 at the same time. In some embodiments, and upon growing at least one layer of graphene on the metal layer 110, the metal layer comprising at least one graphene layer (e.g., a first graphene layer 118 and/or a second graphene layer 108) may be placed on a surface portion of the core 116.

As shown in block 506, the method 500 may comprise the step of applying a conductive layer to the first graphene layer. In some embodiments, the lamination stack (100, 200, 300, 400) may comprise a conductive layer that is a metal layer 110, such as a copper layer and/or the like, which may be used to grow a first graphene layer 118 on the surface (e.g., a top surface) of the conductive layer. In some embodiments, the metal layer 110 may comprise copper.

As shown in block 508, the method 500 may comprise the step of applying a second graphene layer to the metal layer (e.g., a copper layer) 110. In some embodiments, the lamination stack (100, 200, 300, 400) may comprise a second graphene layer, such as that shown as graphene layer 108 in FIGS. 1A, 2A, 3A, and 4A. In some embodiments, the second graphene layer 108 may be grown on the metal layer 110 and/or the graphene layer 108 may be placed on the metal layer 110 to create the lamination stack. In some embodiments, each layer of graphene adjacent to the metal layer (e.g., graphene layer 108 and graphene layer 118) may be grown on the metal layer 110 at the same time. In some embodiments, each graphene layer (108 and/or 118) may comprise multiple layers of graphene.

As shown in block 510, the method 500 may comprise the step of applying a photoresist layer (106) to the second graphene layer. In some embodiments, the lamination stack (100, 200, 300, 400) may comprise a photoresist layer 106 attached and/or placed on the second graphene layer 108. In some embodiments, the photoresist layer 106 may be patterned, such that the light-sensitive material of the photoresist layer may be exposed to light—or another focused energy source such as a laser beam—which will change the layer's solubility or sensitivity with respect to a developer, thereby allowing the layer to be patterned.

As shown in block 512, the method 500 may comprise the step of applying a protective layer to the photoresist layer. In some embodiments, the protective layer 104 may be a material having a resiliency to acidic and basic materials, such as a resiliency to materials comprising Hydrogen scores of one, two, three, four, eleven, twelve, thirteen, or fourteen. Such resiliency may be necessary for the protection of the metal layer 110 during the metal deposition process when forming the vias (e.g., via 151). In some embodiments, the protective layer 104 is a material comprising at least one of a polymethyl methacrylate (PMMA), a polydimethyloxyaniline (PDMA), a poly ethylene vinyl acetate, polyetherimide or a thermoplastic polymer or an elastic polymer. In some embodiments, the protective layer 104 comprises an adhesive tape, a thermal plastic release tape, a dry film photoresist, an atomic deposition layer, or a photoresist. In some embodiments, and where the protective layer 104 is a dry film photoresist, the protective layer 104 may be placed on top of the photoresist layer 106. In some embodiments, properties of the dry film photoresist may be such that the protective layer 104 can be peeled off the underlying photoresist layer 106.

As shown in block 514, the method 500 may comprise the step of drilling through the protective layer and at least one of the photoresist layer, the second graphene layer, the metal layer, the first graphene layer, and/or the core. In some embodiments, the lamination stack may thus comprise a via that is drilled through a portion of each layer (such as the vias 151 shown in FIGS. 3A and 4A). Such a process is described more fully below with respect to FIG. 6.

With reference to FIG. 6, a method 600 for removing a protective layer from a photoresist layer in the lamination stack is described, in accordance with one or more embodiments of the present invention. In some embodiments, the lamination stack 100, 200, 300, and 400 may be used as depictions of the processes described herein.

In some embodiments, and as shown in block 602, the method 600 may comprise the step of applying a metallic plating to the lamination stack, wherein the metallic plating is applied to an outer surface of the lamination stack, such that the metallic plating covers an internal surface of the lamination stack formed by the drilling (e.g., the internal surface of the vias 151). In some embodiments, block 602 and its associated process may occur subsequent to block 514 of FIG. 5 and its associated process. In some embodiments, and before the drilling has occurred, the lamination stack may comprise a strategic application of a protective layer 104 to the lamination stack, such that where the protective layer 104 is placed, the protective layer 104 and any materials overlying the protective layer may be removed from the lamination stack. For instance, and once the drilling has occurred, a metallic plating 102 may be applied to the protective layer 104 and to the rest of the surface of the lamination stack (e.g., the entire surface of the lamination stack and within the via(s) 151).

In some embodiments, and as shown in block 604, the method 600 may comprise the step of removing the protective layer from the photoresist layer, wherein the removal of the protective layer results in the removal of the metallic plating in contact with the protective layer. In some embodiments, and once heat at the predetermined temperature has been applied to the lamination stack, the protective layer 104 and/or 114 (and the adjacent metallic plating 102) may be removed by simply pulling the protective layer 104 and/or 114 (and, along with it, the adjacent metallic plating 102) away from the photoresist layer 106. In some embodiments, the protective layer (and the adjacent metallic plating 102) may be removed by etching the protective layer 104 (and/or 114) and the metallic plating 102.

By way of non-limiting example, the metallic plating 102 in contact with (e.g., overlying) the protective layer 104, 114 may comprise the metallic plating that is touching and/or directly adjacent to the protective layer 104, 114 (such as the top-most and bottom-most metallic plating shown in FIG. 3A). Accordingly, after removing the metallic plating from areas where the plating is not needed (such as top and bottom), the metallic plating shall remain present in other areas of the PCB (e.g., within the via(s) 151) to generate a conductive pathway between the layers of the PCB.

In some embodiments, the removal of the protective layer from the photoresist layer may comprise an application of heat at a predetermined temperature to the lamination stack, where the temperature is based on the material properties of the selected protective layer. For instance, and by way of a non-limiting example, a protective layer 104 may be removed from another layer of material, such as photoresist layer 106, by applying a heat at a predefined temperature to the lamination stack (including the core 116, the first graphene layer 118, the metal layer 110, the second graphene layer 108, the photoresist layer 106, the protective layer 104, and the metallic plating 102). In some embodiments, the predetermined heat may comprise a temperature of a range from approximately 90 degrees Celsius to approximately 180 degrees Celsius. In some embodiments, and based on the properties (e.g., material(s)) used in the protective layer 104, the protective layer 104 may be removed by applying the predetermined heat to the lamination stack. In some embodiments, the protective layer may be a thermal release tape, which may be removed from the photoresist layer by applying heat and/or a specific solvent. For instance, and in some embodiments, heat at a temperature of between 180 and 220 degrees Celsius may be applied for a protective layer comprising a prepreg which has glue properties (such as a thermal release tape).

In some embodiments, the protective layer may comprise a dry film. Such a dry film as a protective layer may be removed by spraying and/or applying a dry film solvent to the surface of the protective layer. In some embodiments, and upon applying the dry film solvent, the protective layer may be peeled off or stripped from the photoresist layer 106.

In some embodiments, and during and/or after the removal of the protective layer 106 and metallic plating 102 on a top and bottom surface of the lamination stack, the photoresist layer 106 may be additionally removed from the lamination stack. For instance, and in some embodiments, a secondary lamination stack may be applied to the (first) lamination stack in order to generate a multi-layer PCB, such that the multi-layer PCB comprises a plurality of different lithographically patterned circuits. In some embodiments, the via(s) (e.g., via 151) may be in the same location for each layer of the lamination stack within the multi-layer PCB, such that each of the vias (e.g., via 151) are aligned to electrically connect the layers of the lamination stacks. As will be understood by a person of skill in the art, similar processes as described herein may be used for each of the lamination stacks within a multi-layer PCB.

Many modifications and other embodiments of the present inventions set forth herein will come to mind to one skilled in the art to which these inventions pertain having the benefit of the teachings presented in the foregoing descriptions and the associated drawings. Therefore, it is to be understood that the present inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. A method of forming a lamination stack comprising:

providing a core;

applying a first graphene layer to a surface portion of the core;

applying a metal layer to the first graphene layer;

applying a second graphene layer to the metal layer;

applying a photoresist layer to the second graphene layer;

following application of the first graphene layer, the metal layer, the second graphene layer, and the photoresist layer, applying a protective layer to the photoresist layer;

drilling through the protective layer and through at least one of the photoresist layer, the second graphene layer, the metal layer, the first graphene layer, or the core;

applying a metallic plating to the lamination stack, wherein the metallic plating is applied to the lamination stack such that the metallic plating covers an internal surface of the lamination stack formed by the drilling; and removing the protective layer from the photoresist layer, wherein removing the protective layer causes a removal of the metallic plating in contact with the protective layer.

2. The method according to claim 1, wherein the metallic plating is a material comprising at least one of palladium, tin, or copper.

3. The method according to claim 1, wherein removing the protective layer comprises applying heat at a predefined temperature to the lamination stack, wherein the predefined temperature is based on a material of the protective layer.

4. The method according to claim 3, wherein the predefined temperature is in a range between 90 degrees Celsius and 180 degrees Celsius.

5. The method according to claim 1, wherein the protective layer is a material having a resiliency to materials comprising a Hydrogen score of at least one, two, three, four, eleven, twelve, thirteen, or fourteen.

6. The method according to claim 1, wherein the protective layer is a material comprising at least one of a polymethyl methacrylate (PMMA), a polydimethyloxyaniline (PDMA), a polyethylene vinyl acetate, a water-insoluble film polymer, a polyetherimide, a thermoplastic polymer, or an elastomeric polymer.

7. The method according to claim 1, wherein the protective layer comprises at least one of an adhesive tape, a thermal release tape, a dry film photoresist, an atomic deposition layer, or a photoresist.

8. The method according to claim 1, wherein the protective layer is applied in a room-temperature environment.

9. A lamination stack integrating copper-graphene laminate comprising:

a core;

a first graphene layer disposed on a surface portion of the core;

a metal layer disposed on the first graphene layer;

a second graphene layer disposed on the metal layer;

a photoresist layer disposed on the second graphene layer; and a protective layer disposed on the photoresist layer, wherein subsequent removal of the protective layer is configured to remove from the lamination stack any materials overlying the protective layer, wherein the lamination stack defines an opening through the protective layer and at least one of the photoresist layer, the second graphene layer, the metal layer, the first graphene layer, or the core.

10. The lamination stack according to claim 9, further comprising a metallic plating disposed on a surface of the lamination stack, such that the metallic plating covers an internal surface of the lamination stack defined by the opening.

11. The lamination stack according to claim 10, wherein the metallic plating is a material comprising at least one of palladium or copper.

12. The lamination stack according to claim 10, wherein the subsequent removal of the protective layer is configured to remove the metallic plating in contact with the protective layer and the protective layer.

13. The lamination stack according to claim 9, wherein the metal layer defines a gap.

14. The lamination stack according to claim 13, wherein the first graphene layer and the second graphene layer are cut to correspond to the gap.

15. The lamination stack according to claim 9, wherein the protective layer is a material having a resiliency to materials comprising a Hydrogen score of at least one, two, three, four, eleven, twelve, thirteen, or fourteen.

16. The lamination stack according to claim 9, wherein the protective layer is a material comprising at least one of a polymethyl methacrylate (PMMA), a polydimethyloxyaniline (PDMA), a polyethylene vinyl acetate, polyetherimide, a water-insoluble film polymer, a thermoplastic polymer, or an elastomeric polymer.

17. The lamination stack according to claim 9, wherein the protective layer comprises at least one of an adhesive tape, a dry film photoresist, an atomic deposition layer, or a photoresist.

18. The lamination stack according to claim 9, wherein the protective layer is applied in a room-temperature environment.

19. The lamination stack according to claim 9, wherein the opening is a via.

* * * * *